United States Patent
Masukawa et al.

(10) Patent No.: US 11,725,078 B2
(45) Date of Patent: Aug. 15, 2023

(54) METHOD FOR PRODUCING ACID-DECOMPOSABLE POLYMER

(71) Applicant: MARUZEN PETROCHEMICAL CO., LTD., Tokyo (JP)

(72) Inventors: Tomohiro Masukawa, Ichihara (JP); Ryo Fujisawa, Ichihara (JP)

(73) Assignee: Maruzen Petrochemical Co., Ltd., Tokyo (JP)

(*) Notice: Subject to any disclaimer, the term of this patent is extended or adjusted under 35 U.S.C. 154(b) by 510 days.

(21) Appl. No.: 16/893,577

(22) Filed: Jun. 5, 2020

(65) Prior Publication Data

US 2021/0024690 A1    Jan. 28, 2021

(30) Foreign Application Priority Data

Jul. 25, 2019   (JP) .................................. 2019-137212

(51) Int. Cl.
| | | |
|---|---|---|
| *B01J 39/05* | (2017.01) | |
| *C08G 63/90* | (2006.01) | |
| *C08G 63/66* | (2006.01) | |
| *G03F 7/004* | (2006.01) | |
| *G03F 7/039* | (2006.01) | |

(52) U.S. Cl.
CPC .............. *C08G 63/90* (2013.01); *B01J 39/05* (2017.01); *C08G 63/66* (2013.01); *G03F 7/0045* (2013.01); *G03F 7/0392* (2013.01)

(58) Field of Classification Search
None
See application file for complete search history.

(56) References Cited

U.S. PATENT DOCUMENTS

| | | |
|---|---|---|
| 5,446,125 A | 8/1995 | Honda et al. |
| 6,090,526 A | 7/2000 | Kumar |
| 6,133,412 A | 10/2000 | Malik et al. |
| 2003/0235777 A1* | 12/2003 | Gronbeck ............ G03F 7/0392 430/905 |
| 2005/0100815 A1 | 5/2005 | Watanabe et al. |
| 2015/0147696 A1 | 5/2015 | Eguchi et al. |

FOREIGN PATENT DOCUMENTS

| | | |
|---|---|---|
| JP | H05-234876 A1 | 9/1993 |
| JP | 2000-029215 A1 | 1/2000 |
| JP | 2002-511505 A1 | 4/2002 |
| JP | 2006-037117 A1 | 2/2006 |
| JP | 2010-189563 A1 | 9/2010 |
| JP | 2014-034601 A1 | 2/2014 |
| JP | 2018-097249 A1 | 6/2018 |
| WO | WO 99/39246 * | 8/1999 |

OTHER PUBLICATIONS

Japanese Office Action (with English translation) dated Jan. 6, 2023 (Application No. 2019-137212).

* cited by examiner

*Primary Examiner* — Tae H Yoon
(74) *Attorney, Agent, or Firm* — Burr Patent Law, PLLC

(57) ABSTRACT

[Problem to be Solved]
To Provide a method for producing an acid-decomposable polymer having a reduced metal ion content, which suppresses decomposition and deprotection of the acid-decomposable polymer.
[Means to Solve the Problem]
The method for producing an acid-decomposable polymer according to the present invention comprises the steps of:
  preparing a polymer solution comprising an acid-decomposable polymer;
  washing an acidic cation exchanger with an organic solvent until the water content in the organic solvent discharged from the acidic cation exchanger falls to 400 ppm or less; and
  passing the polymer solution through the washed acidic cation exchanger to reduce the metal ion content of the polymer.

7 Claims, No Drawings

METHOD FOR PRODUCING ACID-DECOMPOSABLE POLYMER

CROSS REFERENCE TO RELATED APPLICATIONS

This application is based upon and claims the benefit of priority from the prior Japanese Patent Application No. 2019-137212 filed Jul. 25, 2019.

BACKGROUND OF THE INVENTION

Field of the Invention

The present invention relates to a method for producing an acid-decomposable polymer. More particularly, the present invention relates to a method for producing an acid-decomposable polymer having a reduced metal ion content using an acidic cation exchanger having a reduced water content.

Background

Conventionally, fine processing by photolithography has been used in the manufacturing process of a semiconductor device. For example, first, a thin film of a composition for photolithography such as a photoresist or an antireflection film is formed on a semiconductor substrate such as a silicon wafer. Then, active ray such as ultraviolet ray is irradiated through a mask pattern on which a pattern of a semiconductor device is drawn, and a photoresist pattern obtained by development is used as a protective film to perform an etching treatment on the substrate, thereby forming fine concavities and convexities corresponding to the pattern on the substrate surface.

Meanwhile, in the production of high-density integrated circuits, computer chips, and computer hard drives, metal ion contamination is a major factor which often induces increased defects and yield loss, leading to degradation of performance. For example, in a plasma process, the presence of metal ions, such as sodium and iron, in a composition for photolithography can cause contamination during plasma stripping. However, these problems can be suppressed to a degree that is not substantially problematic in the manufacturing process by utilizing HCl gettering of contaminants during high temperature annealing cycles.

On the other hand, when a polymer compound such as a photoresist, an antireflection film or the like, i.e., the composition for photolithography is produced, free acids or gel particles may remain or be generated in the polymer compound and/or the polymer compound solution. These factors can lead to the failure of photoresist, antireflective coating, and other electronic materials, such as hard mask coating, interlayer coating, and fill layer coating.

With the development of fine processing techniques such as photolithography, electronic devices have become more elaborate, and these problems have become difficult to solve completely. It has often been observed that the presence of very low levels of metal ion impurities reduces the performance and stability of the semiconductor devices.

It has also been apparent that metal ion impurity concentrations of about 100 ppb in compositions for photolithography adversely affect the performance and stability of such electronic devices. Conventionally, the metal ion impurity concentration in a composition for photolithography has been controlled by selecting a material satisfying a strict impurity concentration standard and by performing a thorough process control so that the metal ion impurities are not mixed into the composition for photolithography in the preparation stage.

Patent Document 1 discloses a method for removing ionic impurities and metal ion impurities from a photoresist composition using a filter containing an ion-exchange resin. Patent Document 2 discloses a method in which a photoresist polymer is subjected to an extraction operation using an organic solvent and water, and metal impurities in an aqueous layer are partitioned and removed. Further, Patent Documents 3 and 4 disclose metal removal methods by adsorption using zeta potential. Further, Patent Document 5 proposes that a resist component solution is brought into contact with a cation exchange resin and a chelate resin for a sufficient period of time so that at least a part of the metal impurities is adsorbed on the cation exchange resin and the chelate exchange resin.

On the other hand, a polymer having a structure such as acetal or hemiacetal which is decomposed at room temperature in the presence of an acid is also used in the polymer composition for photolithography. (Patent Documents 6 and 7).

PRIOR ART DOCUMENTS

Patent Documents

Patent Document 1: Japanese Unexamined Patent Application Publication No. 2018-97249
Patent Document 2: Japanese Unexamined Patent Application Publication No. 2006-37117
Patent Document 3: Japanese Unexamined Patent Application Publication No. 2010-189563
Patent Document 4: Japanese Unexamined Patent Application Publication No. 2014-34601
Patent Document 5: Japanese Unexamined Patent Application Publication No. H5-234876
Patent Document 6: Japanese Patent Application No. 2002-511505
Patent Document 7: Japanese Unexamined Patent Application Publication No. 2000-029215

SUMMARY OF THE INVENTION

Problem to be Solved by the Invention

However, the method described in Patent Document 2 is limited to a water-insoluble polymer, and the metal content cannot be extracted with water in the case of a water-soluble polymer.

Further, in the method disclosed in Patent Document 5, when an acid-decomposable polymer having an acetal structure, a hemiacetal structure, or the like is passed through the cation exchange resin, there is a problem that the polymer is decomposed or the protective group is desorbed (hereinafter, may be referred to as deprotection). In particular, a polymer having a structure in which a carboxyl group is protected by an acetal group has a problem that even a small amount of deprotection generates a carboxylic acid, which greatly influences performance such as an alkali dissolution rate when used as a photoresist.

It is therefore an object of the present invention to provide a method for producing an acid-decomposable polymer having a reduced metal ion content while suppressing the decomposition and deprotection of the acid-decomposable polymer.

A Method for Solving the Problem

In order to solve the above-described problems, the present inventors intensively studied to find that the above problems can be solved by washing the acidic cation exchanger with an organic solvent, reducing the water content in the organic solvent discharged after washing to a specific range or less, and then passing a polymer solution containing an acid-decomposable polymer through the washed acidic cation exchanger, thereby completing the present invention.

That is, according to the present invention, the following invention is provided.

[1] A method for producing an acid-decomposable polymer comprising the steps of:

preparing a polymer solution comprising an acid-decomposable polymer;

washing an acidic cation exchanger with an organic solvent until the water content in the organic solvent discharged from the acidic cation exchanger falls to 400 ppm or less; and passing the polymer solution through the washed acidic cation exchanger to reduce the metal ion content of the polymer.

[2] The method according to [1], wherein the acid-decomposable polymer has an acetal structure or a hemiacetal structure.

[3] The method according to [1], wherein the acidic cation exchanger has a strong acidic cation exchange group as an exchange group.

[4] The method according to [2], wherein the acidic cation exchanger has a strong acidic cation exchange group as an exchange group.

[5] The method according to [1], wherein the polymer solution is a polymerization solution of the acid-decomposable polymer.

[6] The method according to [2], wherein the polymer solution is a polymerization solution of the acid-decomposable polymer.

[7] The method according to [3], wherein the polymer solution is a polymerization solution of the acid-decomposable polymer.

[8] The method according to [4], wherein the polymer solution is a polymerization solution of the acid-decomposable polymer.

[9] The method according to [1], wherein the metal ion content in the acid-decomposable polymer after passing the polymer solution through the washed acidic cation exchanger is 50 ppb or less.

[10] The method according to [2], wherein the metal ion content in the acid-decomposable polymer after passing the polymer solution through the washed acidic cation exchanger is 50 ppb or less.

[11] The method according to [3], wherein the metal ion content in the acid-decomposable polymer after passing the polymer solution through the washed acidic cation exchanger is 50 ppb or less.

[12] The method according to [5], wherein the metal ion content in the acid-decomposable polymer after passing the polymer through the washed acidic cation exchanger is 50 ppb or less.

Effect of the Invention

According to the present invention, it is possible to provide a method for producing an acid-decomposable polymer in which decomposition and deprotection of the acid-decomposable polymer are suppressed and the metal ion content is reduced.

MODE FOR CARRYING OUT THE INVENTION

[Method for Producing Acid-Decomposable Polymer]

The method for producing an acid-decomposable polymer includes a step of preparing an acid-decomposable polymer solution, a step of washing an acidic cation exchanger, and a step of passing the acid-decomposable polymer solution through the washed ion exchanger. The order of the steps of preparing the acid-decomposable polymer solution and washing the acidic cation exchanger is not particularly limited, and either of these steps may be performed first.

(Preparation Step of Acid-Decomposable Polymer Solution)

This step is a step of preparing a solution containing an acid-decomposable polymer. The acid-decomposable polymer used in the present invention has a functional group or structure that is easily decomposed by the action of an acid. Examples of such acid-decomposable polymers include those having an acetal structure or a hemiacetal structure. The acetal or hemiacetal structure may be included in the polymer main chain or in the polymer side chain. As long as the acid-decomposable polymer has these structures, other structures are not particularly limited, and it may be one that can be dissolved in an organic solvent for the solution passing step.

In general, when an attempt is made to reduce the metal ion content of an acid-decomposable polymer having the above-mentioned acid-decomposable structure by means of an ion exchanger having a general water content (about 1000 ppm), the acidic exchange group of the ion exchanger may cause decomposition of the polymer or elimination of the protecting group. Therefore, by obtaining an acid-decomposable polymer having a reduced metal ion concentration by the production method of the present invention, the acid-decomposable polymer can be suitably used as a composition for photolithography.

The organic solvent in which the acid-decomposable polymer is dissolved can be appropriately selected depending on the type of polymer. For example, the solvent used in the polymerization reaction described below can be used as it is.

In the present invention, a polymerization solution of an acid-decomposable polymer can be used as the acid-decomposable polymer solution. The polymerization reaction of the acid-decomposable polymer can be carried out by a known method. For example, there are a batch temperature elevation method in which a monomer is dissolved in a solvent together with a polymerization initiator and polymerized by heating as it is, and a dropping polymerization method in which a monomer and a polymerization initiator are dropped into a heated solvent to be polymerized. In addition, the dropping polymerization method includes a mixed dropping method in which a monomer is dissolved in a solvent as needed together with a polymerization initiator, and then the mixture is dropped in a heated solvent to be polymerized, and an independent dropping method in which the monomer and the polymerization initiator are separately dissolved in a solvent as needed and separately dropped in a heated solvent to be polymerized. In the present invention, a dropping polymerization method is preferred.

Here, in the polymerization system in the case of the batch temperature elevation method, and in the dropping liquid storage tank before dropping into the polymerization system in the case of the mixed dropping method, there is a chance that the unreacted monomers come into contact with the low-concentration radicals in a high concentration state, thus a high-molecular-weight substance having a molecular weight of 100000 or more are likely to be formed, which is one of the causes of generation of pattern defects. On the other hand, in the independent dropping method, since the polymerization initiator and the monomer do not coexist in the dropping liquid storage tank and the concentration of the unreacted monomer is kept low even when dropped into the polymerization system, high polymers are less generated. Thus, the independent dropping method is particularly preferable as the polymerization method in the present invention. Note that, in the mixed dropping method and the independent dropping method, changes may be made to the composition of the monomer to be dropped, the composition ratio of the monomer, the polymerization initiator, and the chain transfer agent together with the dropping time.

Conventionally known polymerization initiators can be used. As the polymerization initiator for radical polymerization, for example, radical polymerization initiators such as azo compounds and peroxides are preferable. Specific examples of the polymerization initiator of the azo compound include 2,2'-azobisisobutyronitrile, 2,2'-azobis (2-methylbutyronitrile), di methyl 2,2'-azobis (2-methylpropionate), 1,1'-azobis (cyclohexane-1-carbonitrile), 4,4'-azobis (4-cyanovalerate), and the like. Specific examples of the polymerization initiator of the peroxide include decanoyl peroxide, lauroyl peroxide, benzoyl peroxide, bis (3,5,5-trimethylhexanoyl) peroxide, succinate peroxide, tert-butyl peroxy-2-ethyl hexanoate, tert-butyl peroxy pivalate, 1,1,3,3-tetramethylbutyl peroxy-2-ethylhexanoate, and the like. These may be used alone or in combination. The polymerization initiator of the azo compound is more preferable because of excellent handling safety. The amount of the polymerization initiator to be used can be selected depending on the desired molecular weights, types of monomers, polymerization initiators, chain transfer agents, solvents and the like, the composition of the repeating unit, the polymerization temperature, the dropping rate and the like.

The polymerization initiator is preferably added to the polymerization system in a dissolved state in an organic solvent. The organic solvent in which the polymerization initiator is dissolved is not particularly limited as long as it can dissolve the polymerization initiator. Specific examples thereof include ketones such as acetone, methyl ethyl ketone, methyl isobutyl ketone, methyl isoamyl ketone, methyl amyl ketone, and cyclohexanone; alcohols such as methanol, ethanol, and isopropanol; ether alcohols such as ethylene glycol monomethyl ether, ethylene glycol monoethyl ether, propylene glycol monomethyl ether, and propylene glycol monoethyl ether; ether esters such as ethylene glycol monomethyl ether acetate, ethylene glycol monoethyl ether acetate, propylene glycol monomethyl ether acetate, and propylene glycol monoethyl ether acetate; esters such as methyl acetate, ethyl acetate, propyl acetate, isopropyl acetate, butyl acetate, methyl propionate, methyl lactate, and ethyl lactate; ethers such as tetrahydrofuran, 1,4-dioxane, and ethylene glycol dimethyl ether; and aromatic hydrocarbons such as toluene and xylene; N,N-dimethylformamide; and acetonirtile. These solvents may be used alone or in combination.

As the chain transfer agent, those known as chain transfer agents can be used as necessary. Among them, a thiol compound is preferable, and a selection can be made from a wide range of known thiol compounds. Specific examples thereof include t-dodecylmercaptan, mercaptoethanol, mercaptoacetic acid, and mercaptopropionic acid. A thiol compound having a structure in which a 2-hydroxy-1,1,1,3,3,3-hexafluoro-2-propyl group is bonded to a saturated aliphatic hydrocarbon is particularly preferable because it has an effect of suppressing roughness and defects in a lithography pattern. The amount of the chain transfer agent to be used can be selected depending on the desired molecular weight, types of monomers, polymerization initiators, chain transfer agents and solvents, the composition of the repeating unit, the polymerization temperature, the dropping rate, and the like.

The monomer and the polymerization initiator in the dropping liquid can be supplied as they are without being dissolved in the solvent when they themselves are a liquid, but when they are a viscous liquid or a solid, it is necessary to dissolve in the solvent for use. It is preferable that the concentration of the monomer or the polymerization initiator is high from the viewpoint of productivity; however, if the concentration is too high, the solution viscosity becomes high and can worsen the operability, or in the case where the monomer or the polymerization initiator is a solid, precipitation can occur, or dispersion in the polymerization system can take a long time, and high polymers can be easily formed. Therefore, it is preferable to select a concentration within a viscosity range that does not cause a problem in the feeding operation, the concentration which allows sufficient dissolving of each monomer and the polymerization initiator, prevents precipitation thereof, and allows easy diffusion thereof in the polymerization system. The specific concentration varies depending on the combination of the solute and the solvent in each solution, and is usually adjusted so that the total concentration of the entire monomer and the concentration of the polymerization initiator are in the range of, for example, 5 to 60 mass %, preferably 10 to 50 mass %.

The dropping time in the mixed dropping method and the independent dropping method is not preferably short since the short time can cause the molecular weight distribution to be wide and the temperature of the polymerization solution will fall because a large amount of solution is dropped at once. On the contrary, it is not preferably long because the long time will apply unnecessary thermal history to the copolymers and lower the productivity. Therefore, it is usually selected from the range of 0.5 to 24 hours, preferably 1 to 12 hours, and particularly preferably 2 to 8 hours.

Further, after completion of the dropwise addition and after temperature elevation to the polymerization temperature in the batch temperature elevation method, it is preferable to maintain the temperature for a certain period of time, or further elevate the temperature, for example, to aging and allow the remaining unreacted monomer to react. The aging time is preferably not too long since the production efficiency per hour will decrease and more heat history will be applied to the copolymer than necessary. Therefore, it is usually selected within 12 hours, preferably within 6 hours, particularly preferably within 1 to 4 hours.

The solvent used in the polymerization reaction is not particularly limited as long as it can stably dissolve the raw material monomer, the obtained copolymer, the polymerization initiator, and the chain transfer agent. Specific examples of the polymerization solvent include ketones such as acetone, methyl ethyl ketone, methyl isobutyl ketone, methyl isoamyl ketone, methyl amyl ketone, and cyclohexanone; alcohols such as methanol, ethanol, and isopropanol; ether alcohols such as ethylene glycol monomethyl ether, ethylene glycol monoethyl ether, propylene glycol monomethyl ether, and propylene glycol monoethyl ether; esters such as methyl acetate, ethyl acetate, isopropyl acetate, propyl acetate, butyl acetate, methyl propionate, methyl lactate, and ethyl lactate; ether esters such as ethylene glycol monomethyl ether acetate, ethylene glycol monoethyl ether acetate, propylene glycol monomethyl ether acetate, and propylene glycol monoethyl ether acetate; ethers such as tetrahydrofuran, 1,4-dioxane, and ethylene glycol dimethyl ether; aromatic hydrocarbons such as toluene and xylene; N,N-dimethylformamide; and acetonitrile. Acetone, methyl ethyl ketone, methyl isobutyl ketone, isopropanol, propylene glycol monomethyl ether, methyl acetate, ethyl acetate, isopropyl acetate, propyl acetate, methyl propionate, tetrahydrofuran, 1,4-dioxane, ethylene glycol dimethyl ether, toluene, and acetonitrile are preferable from the viewpoint of solubility and boiling point of the monomer, polymerization initiator, chain transfer agent, and copolymer. These may be used alone or in combination of 2 or more. Use may be made to a mixture of compounds having high solubility and high boiling of the monomer, polymerization initiator, chain transfer agent, and copolymer, such as ethylene glycol monobutyl ether, 3-methoxy-3-methyl-1-butanol, 3-methoxy-3-methyl-1-butylacetate, 3-ethoxypropionate ethyl, γ-butyrolactone, diethylene glycol dimethyl ether, N-methyl pyrrolidone, and dimethyl sulfoxide.

The amount of the polymerization solvent to be used is not particularly limited; however if the amount of the solvent is too small, the monomer may precipitate or the viscosity may become too high to maintain the polymerization system uniformly, and if the amount is too large, the conversion rate of the monomer may be insufficient or the molecular weight of the copolymer may not be increased to a desired value. Usually, the amount is 0.5 to 20 parts by weight, preferably 1 to 10 parts by weight, based on 1 part by weight of the monomer.

The amount of the polymerization solvent initially filled into the reaction vessel (hereinafter, may be referred to as the initial filling solvent) in the mixed dropping method and the independent dropping method may be equal to or greater than the minimum amount to allow stirring; however if the amount of the polymerization solvent is excessively large, the amount of the monomer solution that can be supplied is reduced, and production efficiency is lowered. Usually, it is selected, for example, from the range of 1/30 or more, preferably from 1/20 to 1/2, particularly preferably from 1/10 to 1/3 in volume ratio with respect to the final feed quantity (i.e., the total amount of the initial filling solvent and the monomer and initiator solutions to be dropped). A part of the monomer may be mixed beforehand with the initial filling solvent.

The polymerization temperature can be appropriately selected depending on the boiling point of the solvent, the monomer, and the chain transfer agent, and the half-life temperature of the polymerization initiator, and the like. Low temperature cause a problem in productivity since polymerization will not be conducted smoothly, and if the temperature is unnecessarily high, there is a problem in terms of stability of the monomer and the copolymer. Therefore, the temperature is preferably selected in the range of 40 to 160° C. and particularly preferably in the range of 60 to 120° C. Since the polymerization temperature have a large impact on the molecular weight of the copolymer and copolymer composition, it is necessary to control the polymerization temperature precisely. On the other hand, since the polymerization reaction is generally an exothermic reaction and the polymerization temperature tends to rise, there is difficulty in controlling the temperature to a constant temperature. Therefore, in the present invention, it is preferable to include at least 1 or more compounds having a boiling point close to the target polymerization temperature as the polymerization solvents, and to set the polymerization temperature to be equal to or higher than the initial distillation point of the compounds at the polymerization pressure. According to this method, the polymerization temperature can be prevented from elevation by the vaporization latent heat of the polymerization solvent.

The polymerization pressure is not particularly limited and may be any of normal pressure, pressurized pressure or reduced pressure, but is usually normal pressure. In the case of radical polymerization, since a nitrogen gas is generated in the case of an azo system and an oxygen gas is generated in the case of a peroxide system when the radicals are generated from an initiator, it is preferable to perform the polymerization in an open system around the atmospheric pressure in order to prevent the polymerization pressure from fluctuating.

(Washing Step of Acidic Cation Exchanger)

This step involves washing the acidic cation exchanger with an organic solvent to reduce the water content in the acidic cation exchanger. As a washing method, when the acidic cation exchanger is a filter, an organic solvent is passed through the filter, and when it is a granular cation exchange resin, it is filled in a column and the organic solvent is passed through the resin. The acidic cation exchanger usually has a certain amount of water content (about 1000 ppm) in a commercially available state. In the present invention, the acidic cation exchanger is washed with an organic solvent, and the water content in the organic solvent discharged after washing is reduced to 400 ppm or less, preferably 350 ppm or less, and more preferably 300 ppm or less. The water content in the acidic cation exchanger can be measured by a conventionally known method. For example, it can be measured by the Karl Fischer method.

The kind of organic solvent used for washing the acidic cation exchanger is not particularly limited, and the above-mentioned polymerization solvent and the like can be used. The amount of organic solvent is not particularly limited, and may be in any amount as long as the above-mentioned water content can be achieved.

The exchange group of the acidic cation exchanger used in the present invention is not particularly limited, but is preferably a strong acidic cation exchange group, and is generally a sulfonic acid group. Since the exchangeable group is a strong acidic cation exchange group, it can be used in all pH ranges, and can decompose and exchange not only bases but also neutral salts.

Examples of the form of acidic cation exchanger include a general granular cation exchange resin and a filter including an ion exchange membrane obtained by chemically modifying a cation ion-exchange group on the surface of a polyolefin membrane.

As the acidic cation exchanger, commercially available products may be used, the examples thereof being acidic cation exchange filters such as Zeta Plus 40 QSH (manufactured by 3M), Protego (manufactured by Integlis), and Ion Clean SL (manufactured by Paul), and acidic cation exchange resins such as Amberlyst 15J•WET (manufactured by Organo Corporation), Dawex 50W (manufactured by Muromachi Chemicals Inc.), and DIAION PK (manufactured by Mitsubishi Chemical Corporation).

(Metal Ion Removing Step)

This step involves passing the prepared polymer solution through the washed acidic cation exchanger as described above to reduce the metal ion content in the acid-decomposable polymer. In the present invention, despite of the acid-decomposable polymer, the use of an acidic cation exchanger having a water content reduced to the range described above will reduce the metal ion content in the acid-decomposable polymer without being affected by the decomposition or deprotection by the exchange group of the acidic cation exchanger.

The metal ion content in the acid-decomposable polymer after passing the polymer solution through the washed acidic cation exchanger is preferably 50 ppb or less, more preferably 30 ppb or less, further preferably 20 ppb or less, and still more preferably 10 ppb or less. When the concentration of the metal ion in the acid-decomposable polymer is reduced within the above range, the acid-decomposable polymer can be suitably used as a composition for photolithography.

These contents can be measured by ICP mass spectrometry.

The weight-average molecular weight (Mw) of the acid-decomposable polymer can be appropriately set according to the purpose and is not particularly limited. For example, the weight-average molecular weight (Mw) is preferably in the range of 1,000 to 300,000, preferably in the range of 2,000 to 100,000, further preferably in the range of 3,000 to 80,000, and still more preferably in the range of 5,000 to 50,000.

In the present invention, the weight-average molecular weight (Mw) of the acid-decomposable polymer is a value measured by GPC (gel permeation chromatography) and can be measured under the measurement conditions described below.

EXAMPLES

Hereinafter, embodiments of the present invention will be described more specifically with reference to Examples. However, the present invention is not limited to these Embodiments. Unless otherwise specified, parts are based on mass.

[Weight Average Molecular Weight]

The weight average molecular weight (Mw) of the polymer synthesized below was measured by GPC (gel permeation chromatography) using polystyrene as a standard. A sample for analysis was prepared by dissolving in 2 mass % solid. The injection volume of sample to the apparatus was 50 μl.

Measuring Device: "HPLC-8320 GPC" manufactured by Tosoh

Detector: Differential Refractive Index (RI) Detector

Column: Shodex GPC LF 804 x 3 (manufactured by Showa Denko K.K.)

Eluent: tetrahydrofuran

Flow rate: 1.0 mL/min

Temperature: 40° C.

Calibration curve: Prepared using a polystyrene standard sample (manufactured by Tosoh)

[Acetal Protection Ratio]

Acetal Protection rate of the polymer synthesized below was analyzed by $^{13}$C-NMR. A sample for analysis was prepared by dissolving 2 g of polymer solution and 0.1 g of Cr (III) acetylacetonate in 1.0 g of heavy acetone.

Apparatus: "AVANCE 400", manufactured by Bruker

Nuclide: $^{13}$C

Measurement method: inverse gate decoupling

Accumulation: 6000

Measurement Tube Diameter: 10 mmφ

[Metal Ion Concentration]

The concentration of metal ions (sodium ion, potassium ion, calcium ion, iron ion) of the polymer synthesized below before and after passing the solution was measured by ICP mass spectrometry.

ICP mass spectrometer: "Agilent7500cs" manufactured by Agilent Technologies K.K.

[Water Content]

The water content in organic solvent discharged when the acidic cation exchanger was washed was measured by the Karl Fischer method.

Karl Fischer Device: AQ 2200 manufactured by Hiranuma Sangyo Co., Ltd.

Electrolyte: HYDRANAL Coulomat AK

Counter Electrode: HYDRANAL Coulomat CG-K

Example 1

To a recovery flask equipped with a thermometer, a condenser, and a stirring device were added 537 parts of propylene glycol methyl ether acetate (hereinafter referred to as PGMEA), 4.0 parts of 10 mass % methane sulfonic acid (PGMEA solution), and 2.7 parts of pure water, and the mixture was cooled to 5° C. Subsequently, 540 parts of diethylene glycol monovinylether (hereinafter referred to as DEGV) was added dropwise to the recovery flask over 2 hours. After completion of the dropwise addition, the temperature was raised to 25° C., and the mixture was aged for 4 hours to conduct reaction. After completion of the reaction, 330 parts of PGMEA was charged into the polymerization solution to conduct dilution. Thereafter, the polymerization solution was treated with 37.2 parts of Amberlyst B20-HG•DRY (manufactured by Organo Corporation), i.e., a weakly basic anion exchange resin, for about 6 hours to remove the acid catalyst (methane sulfonic acid) in the polymerization solution. The acid decomposable polymer was sampled from the obtained polymer solution, and the weight average molecular weight (Mw) and the metal ion concentration of the polymer were measured.

A polymer represented by the following formula was obtained from the above reaction.

[Chemical formula 1]

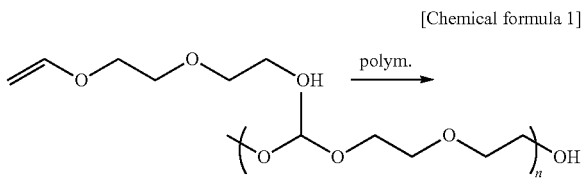

Zeta Plus B90-40QSH (manufactured by 3M, hereinafter referred to as 40QSH) which is an acidic cation exchange filter was washed by passing PGMEA through it, and the water content in discharged PGMEA was confirmed to have reduced to 140 ppm. Subsequently, 200 parts of the polymer solution was passed through the washed 40QSH for 30 minutes to reduce the metal ion. The metal ion concentration in the acid-decomposable polymer was analyzed. Table 1 shows the water content in the organic solvent discharged after washing 40QSH, and the weight-average molecular weight (Mw) and the metal ion concentration of the acid-decomposable polymer before and after passing the polymer solution through the 40QSH.

Example 2

Polymerization and subsequent removal of the acid catalyst (methane sulfonic acid) were conducted under the same conditions as in Example 1 to obtain a polymer solution. The acid-decomposable polymer was sampled from the obtained polymer solution, and the weight average molecular weight (Mw) and the metal ion concentration of the polymer were measured.

5.2 parts of Amberlyst 15J•WET (manufactured by Organo Corporation, hereinafter referred to as 15J) which is an acidic cation exchange resin, was washed with PGMEA beforehand, and the water content in the discharged PGMEA was confirmed to have reduced to 300 ppm. Subsequently, 200 parts of the polymer solution was passed through the washed 15J for 40 minutes to reduce the metal ion. The metal ion concentration in the obtained acid-decomposable polymer was analyzed. Table 1 shows the water content in the organic solvent discharged from the ion-exchange resin at the end of washing, and the weight average molecular weight (Mw) and the metal ion concentration of the acid-decomposable polymer before and after passing the polymer solution through the 15J.

Example 3

To a recovery flask equipped with a thermometer, a condenser, and a stirring device were added 266 parts of HPS-H10K (manufactured by Maruzen Petrochemical, Mw=10,000, p-hydroxystyrene homopolymer, 30 mass % PGMEA solution), 1.9 parts of 10 mass % trifluoroacetic acid (PGMEA solution), and 42 parts of PGMEA, and the mixture was heated to 40° C. Subsequently, a solution obtained by mixing 19.5 parts of ethyl vinyl ether and 18.6 parts of PGMEA was added dropwise to the recovery flask over 30 minutes. After completion of the dropwise addition, the reaction was conducted at 40° C. for 4 hours. After completion of the reaction, 42 parts of PGMEA was charged into the reaction solution for dilution. Thereafter, the reaction solution was treated with 3.7 parts of Amberlyst B20-HG•DRY (manufactured by Organo Corporation) for about 6 hours to remove the acid catalyst (trifluoroacetic acid) in the reaction solution. The acid-decomposable polymer was sampled from the obtained polymer solution, and the weight average molecular weight (Mw), the acetal protection rate, and the metal ion concentration were measured.

A polymer represented by the following formula was obtained by the above reaction.

[Chemical formula 2]

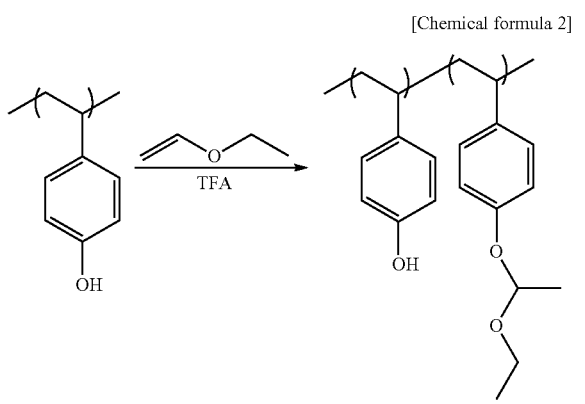

40QSH which is an acidic cation exchange filter was washed by passing PGMEA through it, and the water content in discharged PGMEA was confirmed to have reduced to 120 ppm. Subsequently, 200 parts of the polymer solution was passed through the washed 40QSH for 30 minutes to reduce the metal ion. The metal ion concentration in the acid-decomposable polymer was analyzed. Table 1 shows the water content in the organic solvent discharged from the ion-exchange resin at the end of washing, the weight-average molecular weight (Mw), the acetal protection rate, and the metal ion concentration of the acid-decomposable polymer before and after passing the polymer solution through the 40QSH.

Example 4

To a recovery flask equipped with a thermometer, a condenser, and a stirring device were added 152 parts of 1-(butoxy)ethyl methacrylate (hereinafter referred to as BEMA), 9.2 parts of dimethyl-2,2'-azobisisobutyrate, and 350 parts of methyl ethyl ketone, and the mixture was reacted under reflux conditions for 4 hours. After completion of the reaction, the mixture was dropped into a mixed solution of 1596 parts of methanol and 154 parts of pure water to precipitate the acid-decomposable polymer. Subsequently, filtration was performed to dissolve the recovered polymer in 1000 parts of PGMEA. The acid-decomposable polymer was sampled from the obtained polymer solution, and the weight average molecular weight (Mw), the acetal protection rate, and the metal ion concentration were measured.

A polymer represented by the following formula was obtained by the above reaction.

[Chemical formula 3]

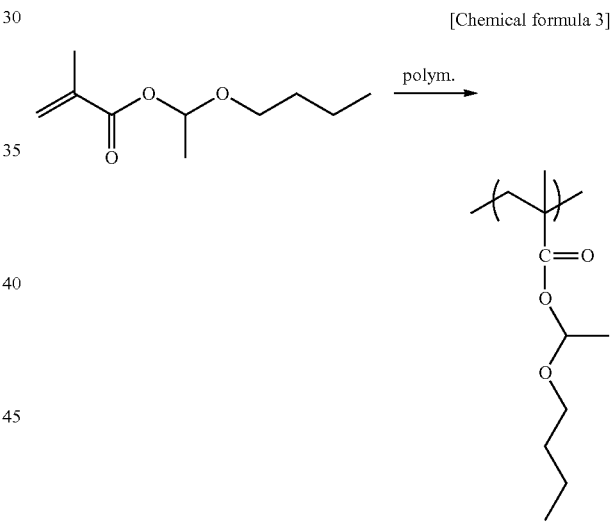

40QSH which is an acidic cation exchange filter was washed by passing PGMEA through it, and the water content in the discharged PGMEA was confirmed to have reduced to 120 ppm. Subsequently, 200 parts of the polymer solution was passed through the washed 40QSH for 30 minutes to reduce the metal ion. The metal ion concentration in the obtained acid-decomposable polymer was analyzed. Table 1 shows the water content in the organic solvent discharged from the ion-exchange resin at the end of washing, and the weight-average molecular weight (Mw), the acetal protection rate, and the metal ion concentration of the acid-decomposable polymer before and after passing the polymer solution through the 40QSH.

Comparative Example 1

Polymerization and subsequent removal of the acid catalyst were conducted under the same conditions as in Example 1 to obtain a polymer solution. The acid-decomposable polymer was sampled from the obtained polymer solution, and the weight average molecular weight (Mw) was measured.

40QSH which is an acidic cation exchange filter was washed by passing PGMEA through it, and the water content in the discharged PGMEA was measured. The water content was 840 ppm. Subsequently, 200 parts of the polymer solution was passed through the washed 40QSH for 30 minutes. The weight average molecular weight (Mw) of the acid-decomposable polymer after passing through 40QSH was measured to confirm the presence or absence of decomposition. Table 1 shows the water content in the organic solvent discharged from the ion exchange filter at the end of washing and the weight-average molecular weight (Mw) of the acid-decomposable polymer before and after passing the polymer solution through the 40QSH.

Comparative Example 2

Reaction and subsequent removal of the acid catalyst were conducted under the same conditions as in Example 3, to obtain a polymer solution. The acid-decomposable polymer was sampled from the obtained polymer solution, and the weight average molecular weight (Mw) and the acetal protection rate were measured.

40QSH which is an acidic cation exchange filter, was washed by passing 200 parts of PGMEA through it, and the water content in discharged PGMEA was measured. The moisture content was 940 ppm. Subsequently, 200 parts of the polymer solution was passed through the washed 40QSH for 30 minutes. The weight average molecular weight (Mw) and the acetal protection rate of the acid-decomposable polymer after passing the polymer solution through the 40QSH was measured to confirm the presence or absence of decomposition. Table 1 shows the water content in the organic solvent discharged from the ion exchange filter at the end of washing, and the weight-average molecular weight (Mw) and the acetal protection rate of the acid-decomposable polymer before and after passing the polymer solution through the 40QSH.

Comparative Example 3

Polymerization was carried out under the same conditions as in Example 4. The acid-decomposable polymer was sampled from the obtained polymer solution, and the weight average molecular weight (Mw) and the acetal protection rate were measured.

40QSH which is an acidic cation exchange filter was washed by passing 200 parts of PGMEA through it, and the water content in the discharged PGMEA was measured. The water content was 830 ppm. Subsequently, 200 parts of the polymer solution was passed through the washed 40QSH for 30 minutes. The weight average molecular weight (Mw) and the acetal protection rate of the acid-decomposable polymer after passing the polymer solution through 40QSH was measured to confirm the presence or absence of decomposition. Table 1 shows the water content in the organic solvent discharged from the ion exchange filter at the end of washing and the weight-average molecular weight (Mw) and the acetal protection rate of the acid-decomposable polymer before and after passing the polymer solution through the 40QSH.

From the results in Table 1, the acid-decomposable polymers obtained in Examples 1 to 4 had no change in the weight average molecular weight (Mw) and the acetal protection rate before and after passing through the ion exchanger, and were not decomposed. Further, the metal ion concentration in the acid-decomposable polymers obtained in Examples 1 to 4 was greatly reduced by passing the polymer solution through the ion exchanger. Particularly, in Examples 1 and 2, potassium ion was reduced from the level of 200 ppb to 1 ppb, whereby a remarkable effect was observed.

On the other hand, in the acid-decomposable polymers obtained in Comparative Examples 1 to 3, the weight average molecular weight (Mw) and the acetal protection rate decreased before and after passing through the ion exchanger, and the acid-decomposable polymers were observed to be partially decomposed.

TABLE 1

| | | Example 1 | | Example 2 | | Example 3 | | Example 4 | |
|---|---|---|---|---|---|---|---|---|---|
| | | Before | After | Before | After | Before | After | Before | After |
| Mw | | 6600 | 6600 | 6600 | 6600 | 10100 | 10100 | 13200 | 13200 |
| Protection rate (%) | | — | — | — | — | 38.7 | 38.7 | 100 | 100 |
| Acidic cation exchange filter | | 40 QSH | | — | | 40 QSH | | 40 QSH | |
| Acidic cation exchange resin | | — | | 15 J | | — | | — | |
| Water content in organic solvent after wash | | 140 ppm | | 300 ppm | | 120 ppm | | 120 ppm | |
| Metallic ion content (resin weight standard) | Na | 4 ppb | 1 ppb | 4 ppb | 1 ppb | 66 ppb | 4 ppb | 9 ppb | 4 ppb |
| | K | 200 ppb | 1 ppb | 200 ppb | 1 ppb | 170 ppb | 1 ppb | 5 ppb | 2 ppb |
| | Ca | 1 ppb | 1 ppb | 1 ppb | 1 ppb | 12 ppb | 1 ppb | 14 ppb | 1 ppb |
| | Fe | 3 ppb | 1 ppb | 3 ppb | 1 ppb | 1 ppb | 1 ppb | 1 ppb | 1 ppb |

TABLE 1-continued

|  |  | Comp. Example 1 | | Comp. Example 2 | | Comp. Example 3 | |
| --- | --- | --- | --- | --- | --- | --- | --- |
|  |  | Before | After | Before | After | Before | After |
| Mw |  | 6600 | 6300 | 10100 | 10000 | 13200 | 12700 |
| Protection rate (%) |  | — | — | 38.7 | 37.6 | 100 | 93.6 |
| Acidic cation exchange filter |  | 40 QSH | | 40 QSH | | 40 QSH | |
| Acidic cation exchange resin |  | — | | — | | — | |
| Water content in organic solvent after wash |  | 840 ppm | | 940 ppm | | 830 ppm | |
| Metallic ion content (resin weight standard) | Na | — | — | — | — | — | — |
|  | K | — | — | — | — | — | — |
|  | Ca | — | — | — | — | — | — |
|  | Fe | — | — | — | — | — | — |

The invention claimed is:

1. A method for producing an acid-decomposable polymer comprising the steps of:
   preparing a polymer solution comprising an acid-decomposable polymer;
   washing an acidic cation exchanger with an organic solvent until the water content in the organic solvent discharged from the acidic cation exchanger falls to 400 ppm or less; and
   passing the polymer solution through the washed acidic cation exchanger to reduce the metal ion content of the polymer,
   wherein the acid-decomposable polymer has an acetal structure or a hemiacetal structure.

2. The method according to claim 1, wherein the acidic cation exchanger has a strong acidic cation exchange group as an exchange group.

3. The method according to claim 1, wherein the polymer solution is a polymerization solution of the acid-decomposable resin.

4. The method according to claim 2, wherein the polymer solution is a polymerization solution of the acid-decomposable resin.

5. The method according to claim 1, wherein the metal ion content in the acid-decomposable polymer after passing the polymer solution through the washed acidic cation exchanger is 50 ppb or less.

6. The method according to claim 2, wherein the metal ion content in the acid-decomposable polymer after passing the polymer solution through the washed acidic cation exchanger is 50 ppb or less.

7. The method according to claim 3, wherein the metal ion content in the acid-decomposable polymer after passing the polymer solution through the washed acidic cation exchanger is 50 ppb or less.

* * * * *